United States Patent
Brambilla et al.

(10) Patent No.: US 6,326,266 B1
(45) Date of Patent: *Dec. 4, 2001

(54) METHOD OF MANUFACTURING AN EPROM MEMORY DEVICE HAVING MEMORY CELLS ORGANIZED IN A TABLECLOTH MATRIX

(75) Inventors: Claudio Brambilla, Concorezzo; Valerio Cassio, Polonghera; Paolo Caprara, Milan; Manlio Sergio Creda, Lomagna, all of (IT)

(73) Assignee: STMicroelectronics S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,849

(22) Filed: Aug. 27, 1998

(30) Foreign Application Priority Data

Aug. 27, 1997 (EP) .................................................. 97830427

(51) Int. Cl.[7] ........................ H01L 21/336; H01L 29/778
(52) U.S. Cl. ............................................ 438/258; 257/315
(58) Field of Search .............................. 257/315; 438/258

(56) References Cited

U.S. PATENT DOCUMENTS

| 4,719,184 | 1/1988 | Cantarelli et al. ................ 437/24 |
|---|---|---|
| 4,833,514 | 5/1989 | Esquivel et al. .................. 357/23.5 |
| 5,081,056 | * 1/1992 | Mazzali et al. ..................... 438/262 |
| 5,313,419 | 5/1994 | Chang .................................. 365/182 |
| 5,712,178 | * 1/1998 | Cho et al. ........................... 438/258 |
| 5,717,635 | * 2/1998 | Akatsu ............................ 365/185.05 |

OTHER PUBLICATIONS

European Search Report Dec. 18, 1997.
Bergemont et al., "Low Voltage NVG: A new High Performance 3 V/5 V Flash Technology for Portable Computing and Telecommunications Applications", Sept. 1996, IEEE Transactions olectron Devices, vol. 43, No. 9, pp. 1510–1517.*

* cited by examiner

Primary Examiner—Olik Chaudhuri
Assistant Examiner—Howard Weiss
(74) Attorney, Agent, or Firm—Lisa K. Jorgenson; Stephen Bongini; Fleit, Kain, Gibbons, Gutman & Bongini P.L.

(57) ABSTRACT

A method of manufacturing a semiconductor virtual ground memory device having a matrix of floating gate memory cells formed on a semiconductor substrate with a plurality of continuous bit lines extending across the substrate as discrete parallel stripes. The device also includes a circuit portion for selection transistors and decode and address circuit portions having P-channel and N-channel MOS transistors. According to the method, N-wells are formed in at least one substrate portion to accommodate the P-channel transistors, active areas of all transistors are defined using a screening mask, and then an isolation layer is grown through the apertures of the screening mask. The screening mask is not open over the matrix region of the memory cells.

10 Claims, 11 Drawing Sheets

METHOD OF MANUFACTURING AN EPROM MEMORY DEVICE HAVING MEMORY CELLS ORGANIZED IN A TABLECLOTH MATRIX

CROSS-REFERENCE TO RELATED APPLICATIONS

This application is based upon and claims priority from prior European Patent Application No. 97-830427.7, filed Aug. 27, 1997, the entire disclosure of which is herein incorporated by reference.

FIELD OF THE INVENTION

The present invention relates to semiconductor memory devices having matrices of virtual ground cells, and more specifically to processes for manufacturing semiconductor virtual ground memory devices that have a matrix of floating gate memory cells and continuous bit lines extending across the substrate as discrete parallel stripes.

BACKGROUND OF THE INVENTION

Conventional semiconductor electronic memory devices of the EPROM or FLASH EPROM type are constructed in the form of cell matrices divided into sections that are essentially sub-matrices formed of memory cell blocks having predetermined dimensions. Each block has bias and address lines to select the individual memory cells and decode the information contained therein. Such a semiconductor memory device is described in Applicant's European Patent No. 0 573 728.

In particular, this patent discloses a process for making an integrated device of the EPROM or FLASH-EPROM type in which the individual memory blocks include a cell matrix made up of a plurality of mutually orthogonal word lines and bit lines. The cross points of the word lines and bit lines define the memory cells. This type of structure is known in the art as a "tablecloth" or cross point matrix, and is peculiar in that the bit lines are formed on the semiconductor substrate by parallel, continuous diffused stripes. The metal contacts are only formed at the opposite ends of the bit lines and provide termination pads for each of the memory blocks. Thus, there are few metal contacts in the area of the integrated memory cells, so the capacity for integration on semiconductor substrate is greatly expanded.

A circuit diagram of this basic configuration is shown in FIG. 1. As shown, opposite contact regions 4 border the floating gate memory cells 3. Each memory cell 3 is bounded by a corresponding continuous main bit line 7, and a discontinuous bit line or bit line "segment" 17. Each segment is connected to an adjacent continuous bit line through an address active clement 20, and there are right and left address active elements 20 for each bit line segment.

Additionally, FLASH memory cells require field oxide isolation areas in order to maintain a high capacitive ratio between the control gate and the floating gate. However, the field oxide occupies much of the circuit area of the semiconductor substrate. Considering the particular instances of EPROMs (which are erased by UV radiation) and OTP memories (which cannot be erased), a high capacitive ratio between the control gate and the floating gate appears to be overkill and adds to the overall dimensions of the integrated circuit. Thus, there is a need for an organizational structure for the memory cells that retains the matrix configuration yet enables the circuit area occupied by the matrix to be greatly reduced.

SUMMARY OF THE INVENTION

In view of these drawbacks, it is an object of the present invention to remove the above-mentioned drawbacks and to provide semiconductor memory devices having virtual ground cell matrices in which very high density memory circuits are produced with reduced dimensions. The field oxide isolation areas are removed from the matrix region for the memory cells of the memory device, and the bit lines in the matrix are isolated by having regions doped opposite from the bit lines.

It is another object of the present invention to provide a process for manufacturing such semiconductor memory devices. N-wells are formed in at least one of the substrate portions to accommodate P-channel transistors, the active areas of all transistors are defined using a screening mask, and then an isolation layer is grown through the apertures of the mask. This produces a semiconductor device in which the area occupied by memory cells in a matrix configuration is greatly reduced.

A first embodiment of the present invention provides a semiconductor memory device having a matrix of memory cells formed on a matrix portion of a substrate. A plurality of continuous bit lines extend across the matrix portion of the substrate as discrete parallel stripes separated by active areas, and at least some transistors for memory cell selection are formed outside the matrix portion of the substrate. Further, the matrix portion of the substrate does not contain any isolation field oxide regions.

A second embodiment of the present invention provides a method for manufacturing a semiconductor memory device having a matrix of floating gate memory cells formed with a plurality of continuous bit lines that extend across the matrix as discrete parallel stripes. According to the method, N-wells are formed in at least a first portion of a substrate in order to accommodate P-channel transistors, active areas for transistors are defined by using a screening mask and growing an isolation layer through apertures in the screening mask, and the memory cell matrix is formed in a second portion of the substrate. Further, the screening mask used for defining the active areas does not have apertures over the second portion of the substrate.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
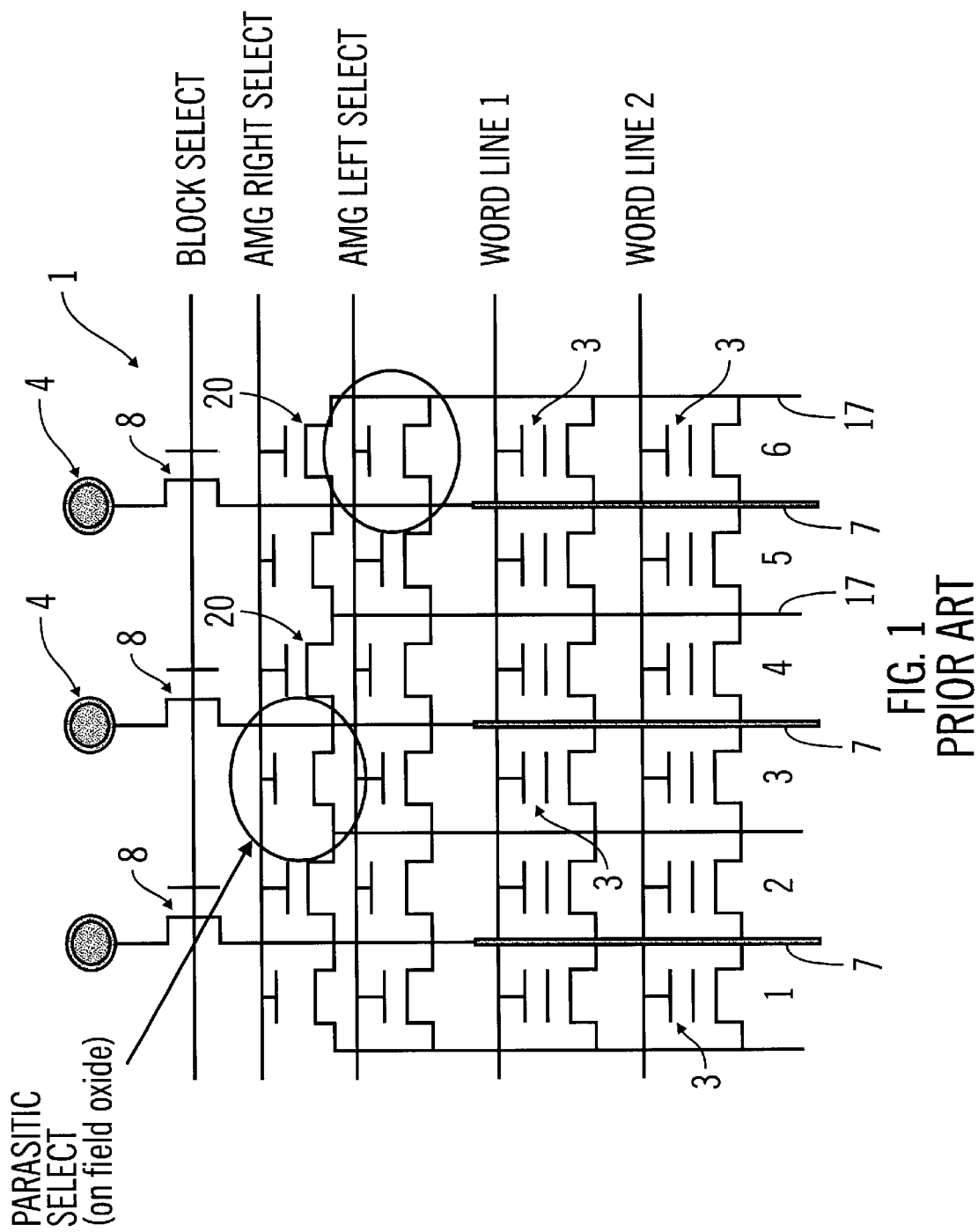
FIG. 1 is a circuit diagram showing a conventional layout of a memory block in an EPROM or FLASH-EPROM device.

For better understanding, reference will frequently be made to FIG. 1, which shows a circuit diagram for a section or block 1 of an EPROM memory device of the virtual ground contact-less type as described in Applicant's European Patent Application No. 96-830657.1. A memory device can include a plurality of sections 1 aggregated to form a memory matrix.

Each section 1 includes a plurality of cells 3 and right and left address and decode devices 20. Specifically, floating gate MOS devices form individual memory cells 3, and control and selection MOS devices 20 perform the functions of addressing and decoding for the individual cells 3. Each n-th memory section 1 is essentially a sub-matrix having address devices 20, and memory cells 3 organized into rows (by word lines) and columns (by bit lines). The sub-matrix is integrated within an area of the semiconductor substrate bounded by opposite regions of contacts 4, which are arranged for contacting the opposite ends of the bit lines formed on the substrate.

For each n-th memory block 1, the contacts 4 that belong to a predetermined region have mirror-like symmetrical correspondence in an opposite contact region at the other end of the bit lines. Thus, the continuous parallel bit lines 7 that extend within the n-th memory section are bounded by opposite pairs of contact regions 4. Alternatively, these contact regions 4 could be provided at just one end of the bit lines. The memory cells 3 are defined at the intersections of the bit lines 5 and the word lines. Specifically, the cells are arranged laterally at such cross points and are bound by discontinuous segmented bit lines 17, which are connected to the main bit lines 7 through the right and left address transistors 20.

Preferably, in each substrate area of the section 1, there is provided at least one interruption in each bit line 7 near a region of contacts 4. The interruption may be implemented by inserting a controlled switch that acts as a section or block selector. In the preferred embodiment, each section includes controlled switches 8 connected to the opposite ends of each bit line 7 near the regions of contracts 4. This allows the bit lines 7 of an n-th memory section 1 to be electronically isolated from the other sections that are cascade connected thereto. For easier integration of the section selectors, it is preferred to have all of the control terminals of the switches 8 positioned near the same region of contacts 4 and connected together.

The manufacturing method for producing the individually selectable memory blocks 1 in integrated form will now be described in detail, with reference to FIGS. 2 through 10. FIGS. 2 to 10 show vertical cross-sections of not necessarily adjacent portions of a semiconductor substrate 10 on which the memory of the preferred embodiment of the present invention is formed. More specifically, a first portion A represents the area where the P-channel transistors of the circuitry associated with the memory matrix are formed and a second portion B represents the area where the N-channel transistors of the circuitry are formed. A third portion C represents the area where the cells of the memory matrix are formed. In some embodiments, the region C is divided into two zones C' and C'' (as shown in FIG. 3) that accommodate the selection transistors and the cell matrix, respectively. In the following description, some steps are not discussed in great detail in order to avoid crowding the specification with elements of secondary importance that are known to persons skilled in the art.

Figure 2:
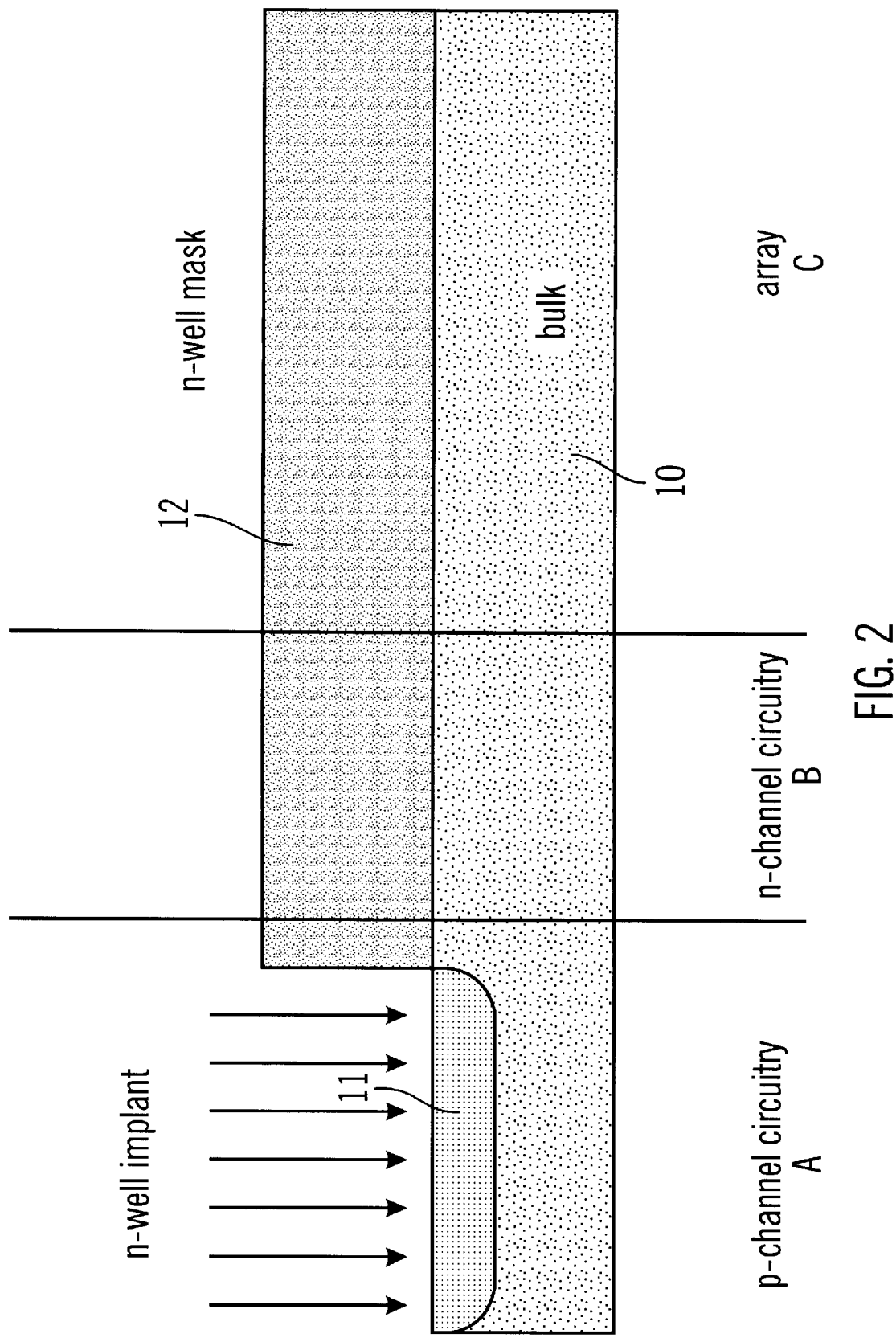
FIGS. 2 through 10 are cross-sectional views showing essential portions of a semiconductor substrate throughout a manufacturing process according to a preferred embodiment of the present invention.
Figure 3:
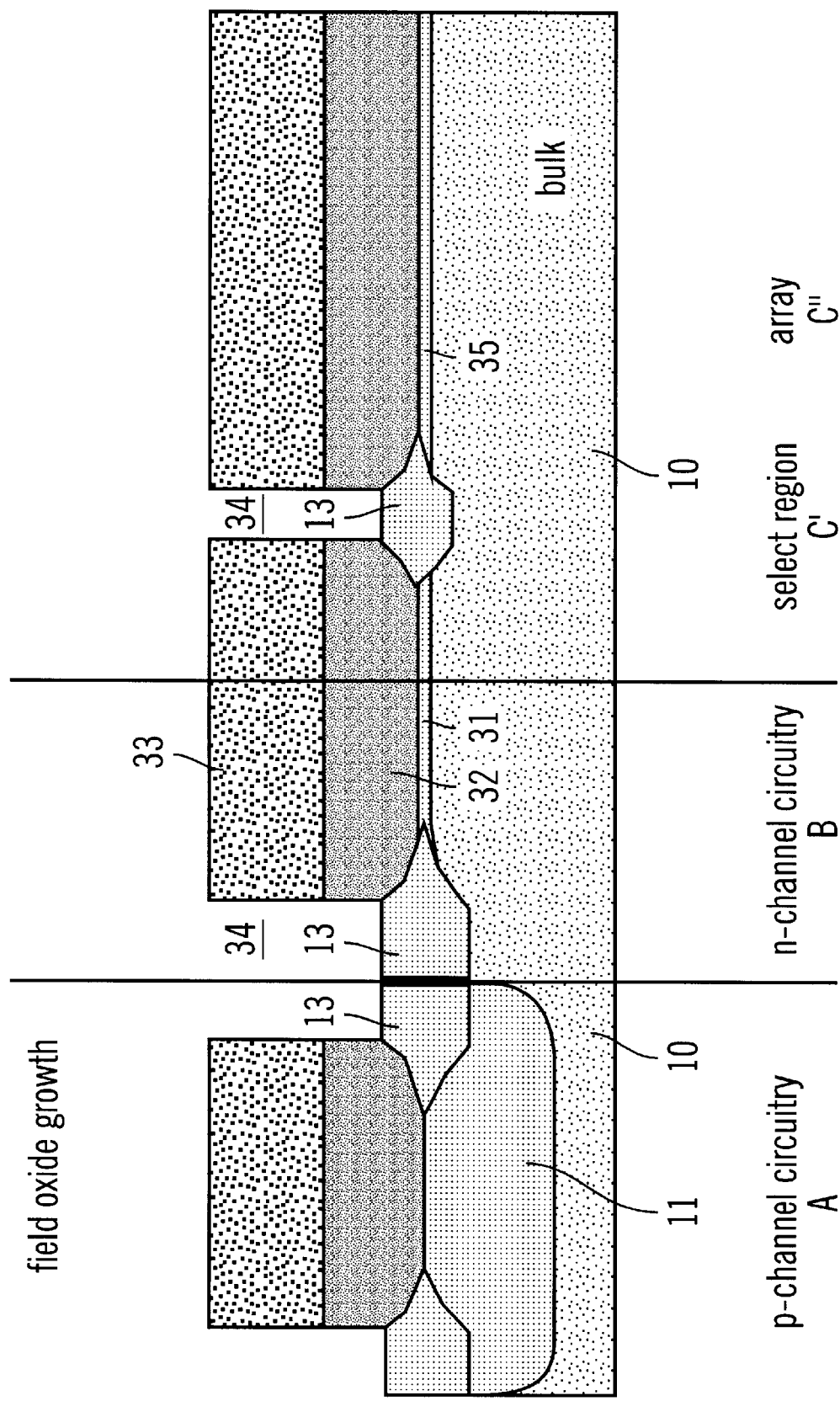

Referring to FIG. 2, N-wells 11 are formed in those portions of the substrate 10 where PMOS transistors are to be formed. The N-wells 11 are preferably formed using an N-well mask 12 to fully cover the substrate 10 except for the areas where the N-wells 11 are to be formed. The N-well mask 12 is then removed in a conventional manner. Next, the active areas of all transistors are formed. The definition of the active areas, which are isolated from each other by isolation regions consisting of a field oxide 13, is performed in a conventional manner. For example, in one specific embodiment, a thin oxide layer 31 is grown to a thickness in the 100 Å to 400 Å range, a layer 32 of silicon nitride is deposited to a thickness of 800 Å to 1500 Å, and the field oxide 13 is then grown (at a temperature of 900° C. to 1800° C.) in areas where the double layer of oxide/silicon nitride has been removed.

The double layer of oxide 31 and nitride 32 is removed using an active area defining mask 33 that is only opened at predetermined locations 34 where the field oxide is to be formed. In preferred embodiments, the field oxide 13 is only provided in the circuit portions A and B of the matrix and in the matrix portions C' where the matrix selection transistors are located. Additionally, in the preferred embodiments, the gate regions of the matrix cells are formed in a truly planar portion of the semiconductor so as to provide improved planarization of the memory device. For these purposes, the active area mask 34 is patterned so as to have a narrow window at those zones where isolation must be provided. In fact, because for a given thermal treatment a thinner layer of field oxide will grow within a zone of limited surface area, a mask so patterned allows a difference of about 2000 Å or 3000 Å to be obtained between the thicknesses of the field oxide of the selection transistors and the field oxide of the transistors in the associated circuitry. Alternatively, two masks could be used: one dedicated to isolating the associated circuitry transistors, and another for isolating the selection transistors. While this allows a thinner field oxide to be grown over the matrix region, the use of separate masks is more expensive.

After defining the active areas, a layer 35 of gate oxide is grown to form the N-channel transistors in the portion B and the selection transistors in the portion C'. A subsequent masking operation allows the gate oxide layer to be removed from the portion C'' of the matrix. An implantation step is carried out without masking to channel dope the memory cells (to be formed later) and to modify the threshold voltages of the P-channel and N-channel transistors. The associated circuitry may be screened by a mask during the matrix implantation. A different oxide layer is grown in the active matrix areas which will be useful to form the memory cells 3.

Figure 4:
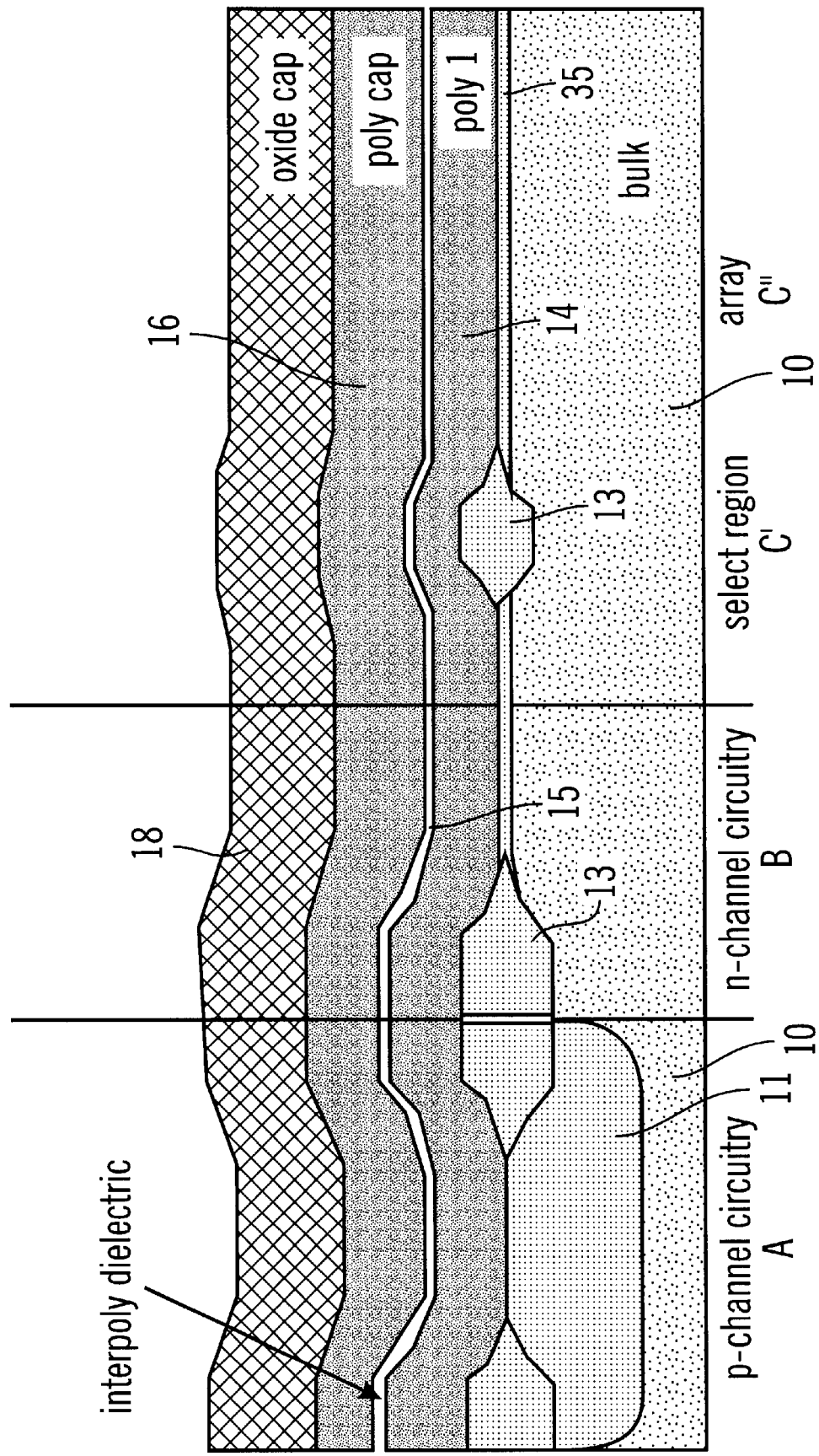

A further isolation implanting mask is provided to screen off the N-wells 11. An isolation implantation is then performed at a suitable energy to allocate the dopant beneath the field oxide 13. A lighter implantation can alternatively be used for the N-channel transistors and the transistors in the zone C'. In order to produce memory cells with capacitive coupling floating gate MOS devices, the preferred process provides for a multiple deposition onto the entire area of the semiconductor in order to produce a structure having a first conductive layer 14 (i.e., POLY1), an interpoly dielectric layer 15, and a second conductive layer 16 (i.e., POLY CAP). In the preferred embodiment, the material employed for the conductive layers 14 and 16 is polysilicon, and the intermediate dielectric layer is of ONO (Oxide-Nitride-Oxide). The POLY CAP layer 16 can be doped at this stage of the process, and a protective oxide layer or top oxide 18 is deposited over the POLY CAP layer 16. FIG. 4 is a view of the structure at this point in the manufacturing process.

Figure 5:
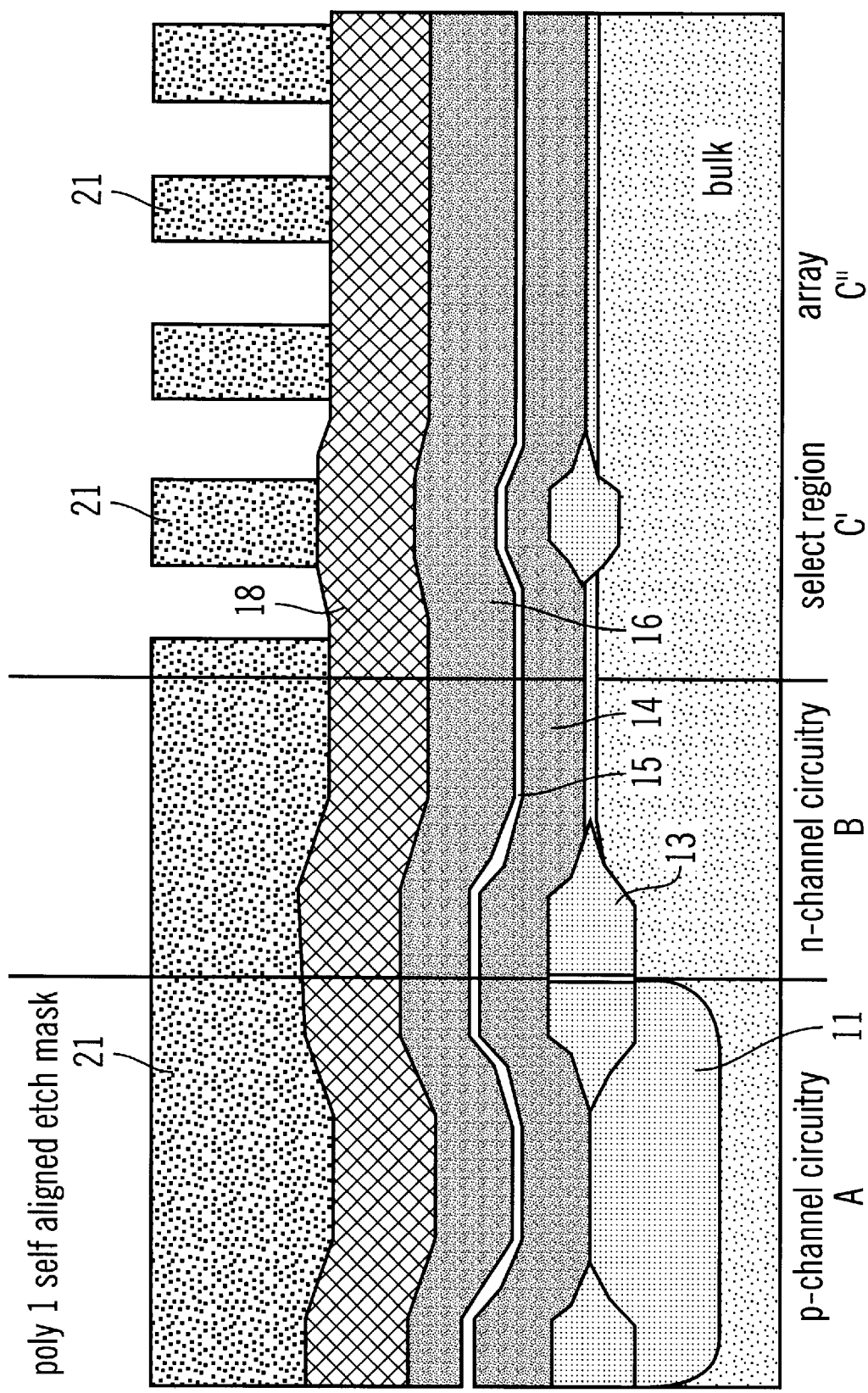
Figure 6:
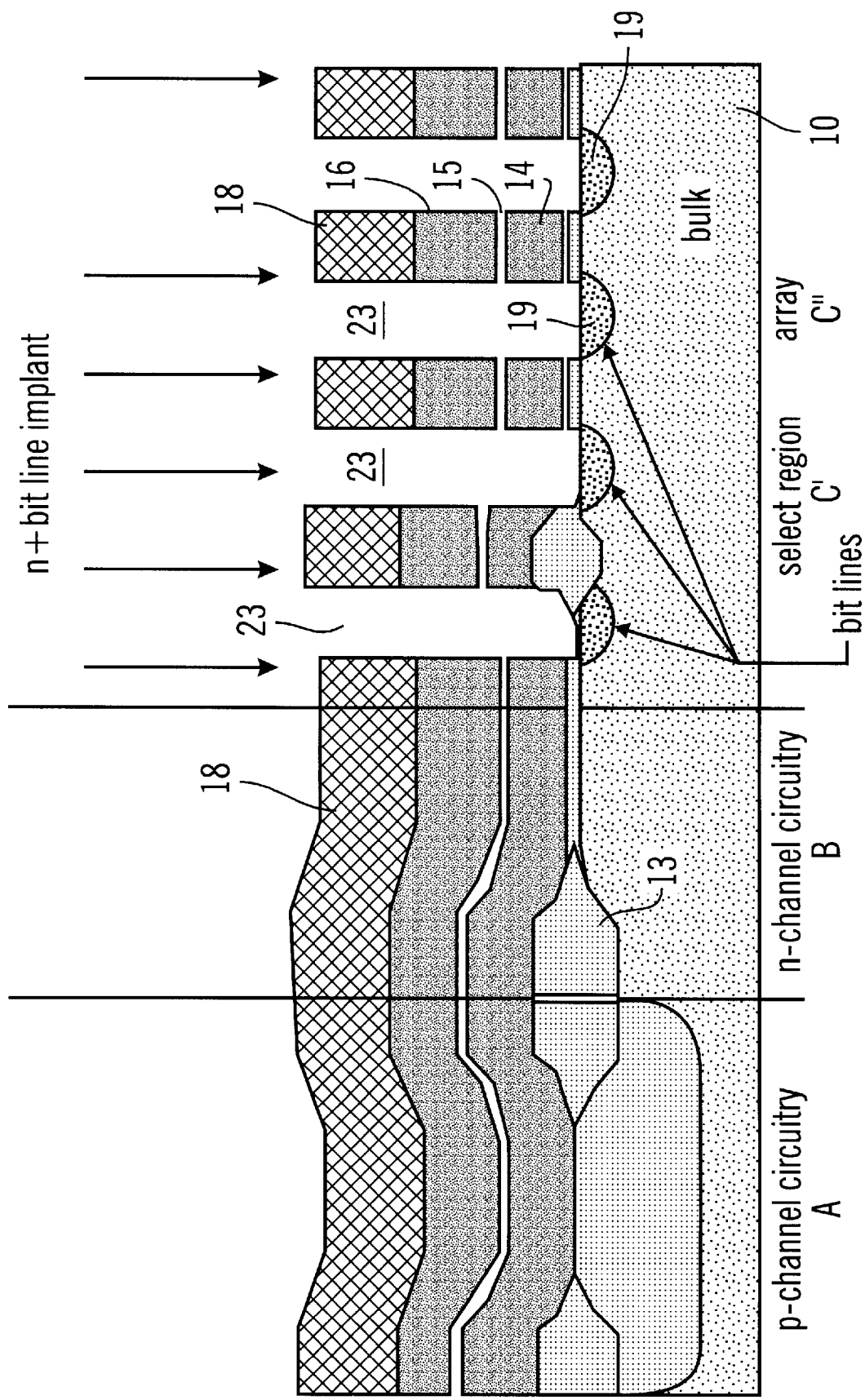

Next, the bit lines of the cell matrix are defined. A mask 21 of resist for defining the polysilicon layer 14 (i.e., the mask of POLY1) is used to define the bit lines 7, as shown in FIG. 5. Through conventional photolithography, the structure unprotected by the POLY1 mask is etched away in cascade to remove (in order) the second conductive layer 16, the intermediate dielectric layer 15, the first conductive layer 14, and the gate oxide, so as to expose the substrate. The POLY1 mask is then removed, and the gate regions are sealed by an oxidation step. An ion implementation step (using for example, arsenic) is performed to confer $N^+$ electric conductivity so as to allow the regions 19 of the bit lines 7 to be defined through the apertures 23 in the structure. The cell matrix then appears as formed by a plurality of continuous stripes separated by openings or grooves 23 through which the implementation has been performed for the formation of the bit line regions 19.

Next, there is the deposition into the grooves 23 of the matrix of a first dielectric layer 27, which in the preferred embodiment is a silicon oxide deposited from a liquid or gaseous phase. That is, the first dielectric layer 27 could be deposited from a liquid phase to form a TEOS-type dielectric, or could be a silane grown from a gaseous phase under predetermined conditions that are effective to prevent cracking or the formation of micro-voids. The thickness of the layer 27 is illustratively in the range of 500 Å to 3000 Å so as to be adequate to isolate the bit lines 7 from each other and to cover the gaps therebetween.

Subsequently, a second dielectric layer 28 is deposited to planarize the surface of the semiconductor substrate by filling the gaps between bit lines 7. This deposition step includes a preliminary dispersion operation or spinning of a gel or liquid phase high-viscosity material and then a setting process. The preferred material is Spin-On Glass (SOG), which includes a mixture of siloxane and alkyl or aromatic organics provided to attenuate the stress on the deposited film. In the preferred embodiment, a mixture of siloxane and methyl compounds is used, and the mixture is converted to a highly planarized dielectric layer 28 by means of appropriate thermal treatments applied at an illustrative temperature of 400° C. This setting (or more properly densifying and branching) process is referred to as the "polymerization." The thickness yielded by this polymerization is illustratively within the range of 3000 Å to 6000Å.

Figure 7:
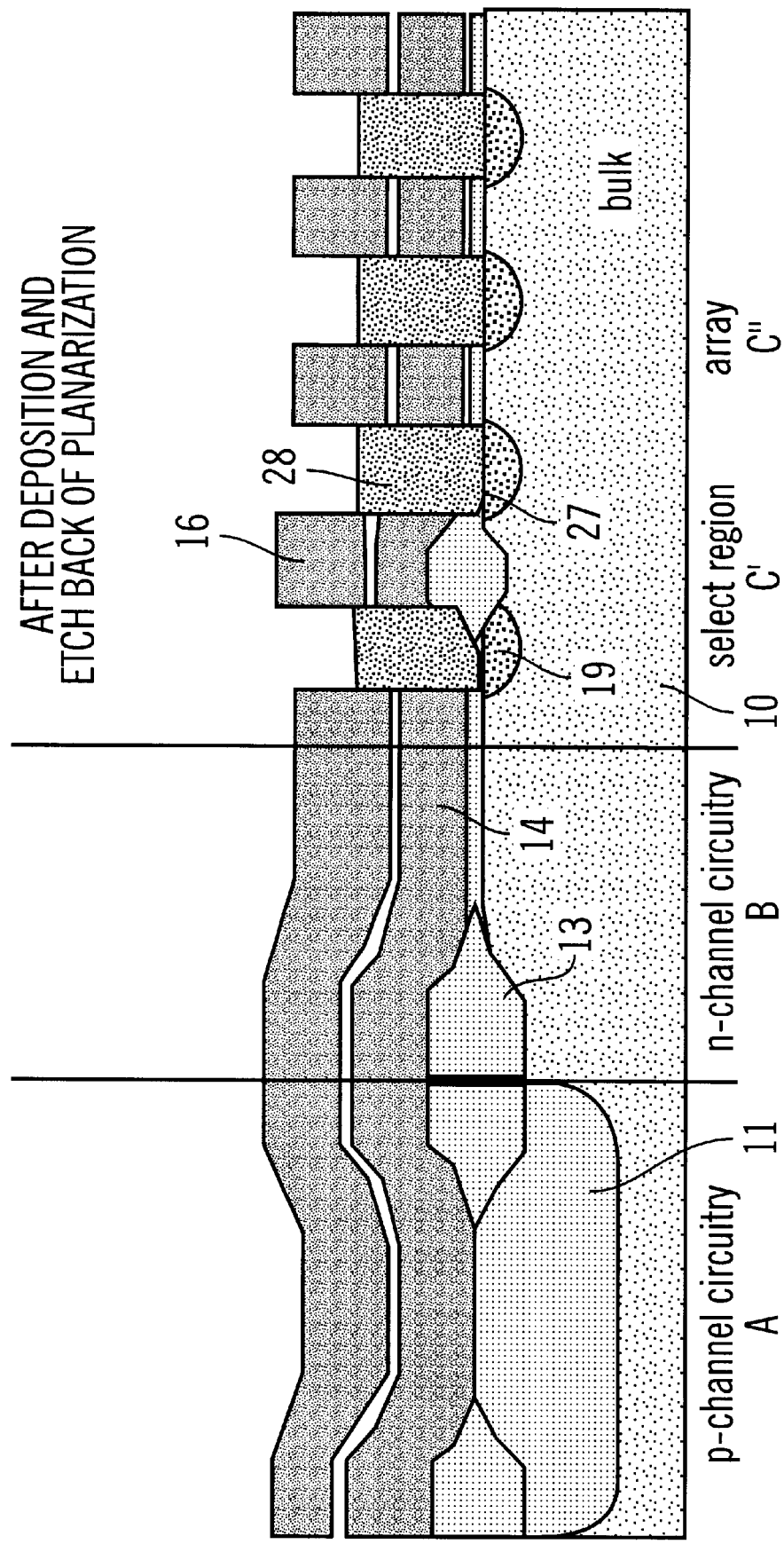

Next, a partial etching of the second dielectric layer 28 is performed using, for example, plasma techniques. This unmasked back-etching is continued until the surface of the POLY CAP 16 is exposed (with the top oxide also being removed). In this way, the second dielectric layer 28 is confined to just the intersticial regions between the bit lines, as shown in FIG. 7. An important feature of this etching is its selectivity to polysilicon. It has also been found experimentally that the selective etching produced by plasma techniques more closely meets the above stated requirements. At this point, an unmasked phosphorus implantation is performed to dope the POLY CAP 16 (if this has not previously been done). In any event, the bit lines are protected by the planarization dielectric layer 28.

Figure 8:
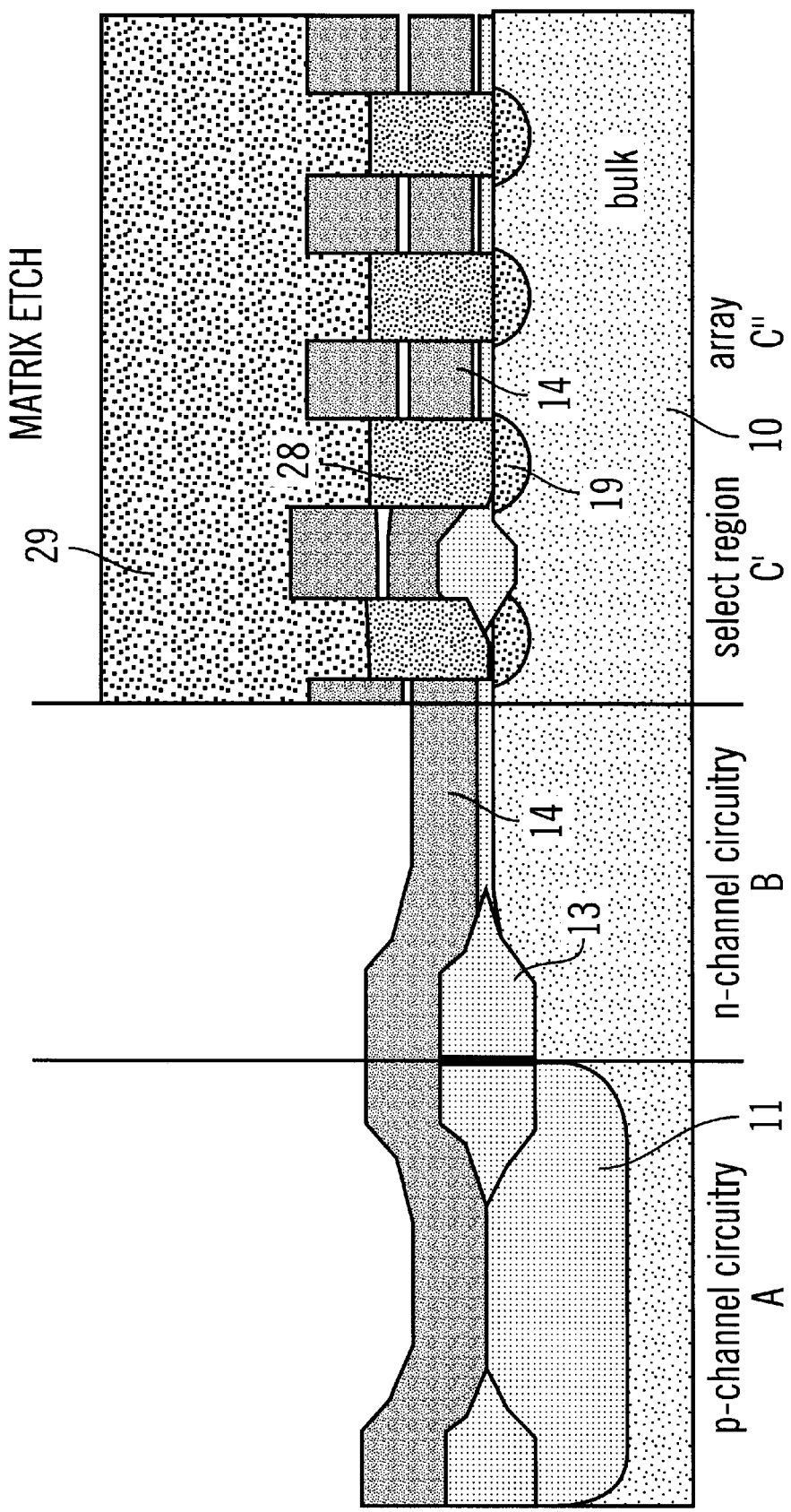

After the planarization process, a new photolithography step is necessary using a mask 29 that is commonly referred to as the matrix mask. This mask, as shown in FIG. 8, serves to remove the second conductive layer 16 and the intermediate dielectric layer 15 from the portions A and B that are intended for the P-channel and N-channel transistors. An optional implantation step can be carried out to adjust the threshold voltages of the transistors in the portions A and B. Next, a multiple deposition is used to produce a conductive layer 25 (i.e., POLY2) and an optional final conductive layer 26. In a preferred embodiment, polysilicon and tungsten silicide ($WSi_2$) are used to form the conductive layer 25 and final conductive layer 26, respectively. These layers are more clearly shown in FIG. 11, which is a perspective view of the structure at this point.

Figure 9:
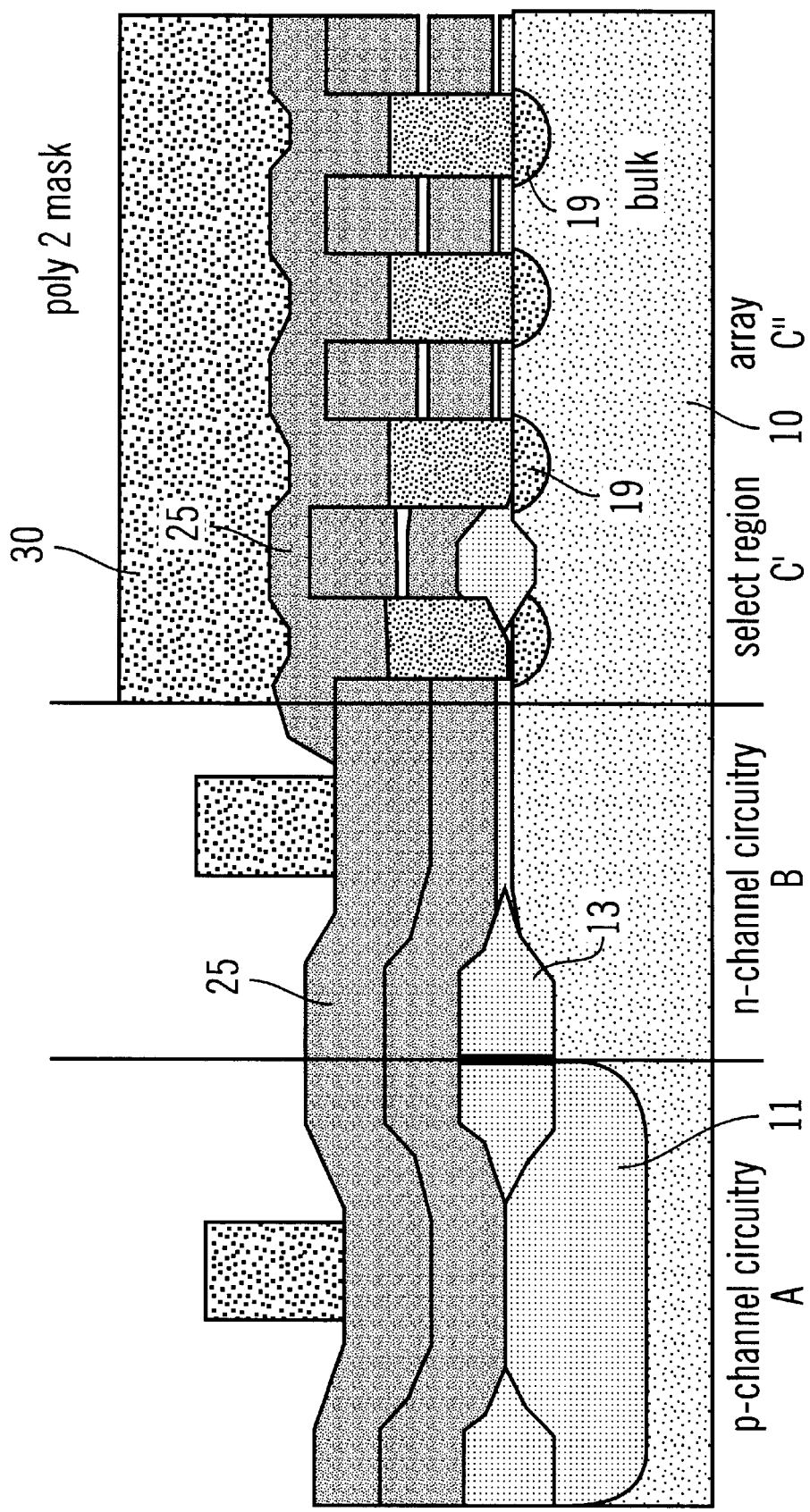
Figure 10:
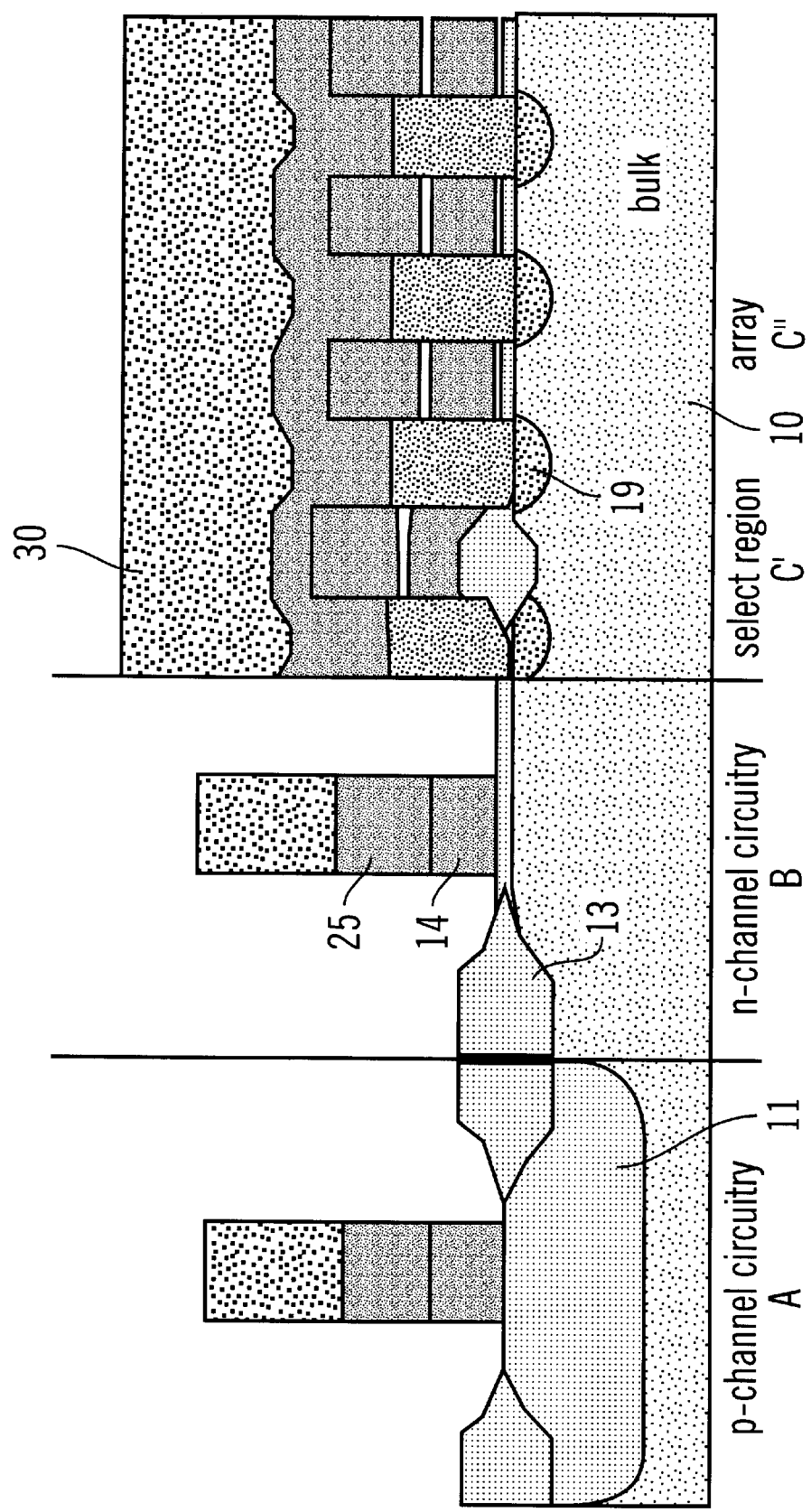

In order to define the gate regions of the memory cells 3, the N-channel and P-channel transistors of the associated circuitry, and the selection transistors, an etching is performed by photolithography using a mask 30 (i.e., the POLY2 mask), as shown in FIG. 9. This mask should have parallel stripes of different widths oriented in a direction orthogonal to the bit lines (like the word lines in FIG. 1). Through the POLY2 mask, the gates of all transistors are defined by etching away the silicide layer 26, the POLY2 25, and the POLY1 14. The etching is stopped at the gate oxide for the CMOS circuitry, and during the step for the matrix, the silicide, the POLY2, and the POLY CAP are etched. The etching is stopped at the interpoly dielectric, and the resist is not removed, as shown in FIG. 10.

Figure 11:
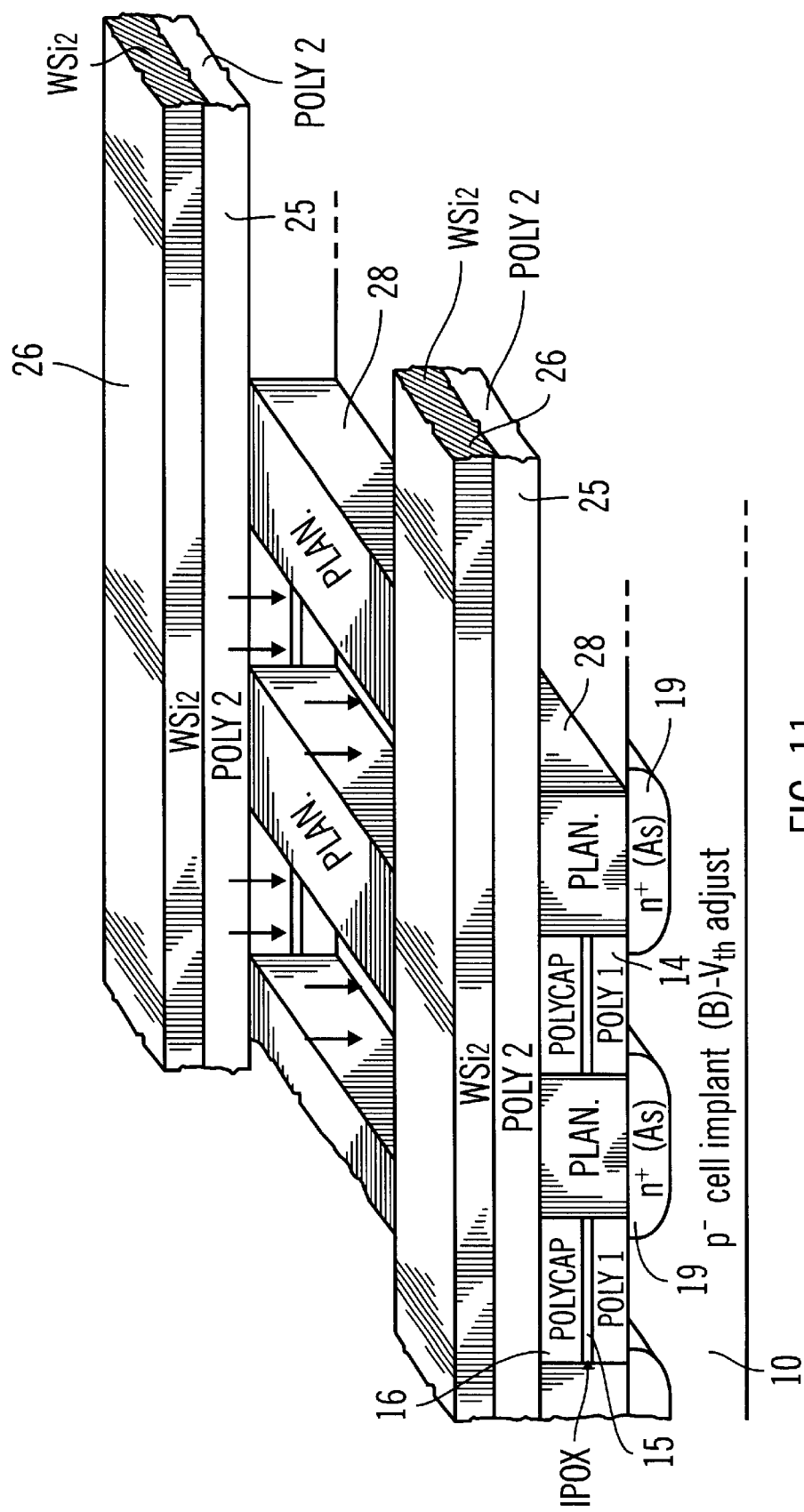
FIG. 11 is a perspective view showing an essential portion of the semiconductor substrate during the manufacturing process according to the preferred embodiment.

A mask is now used for a self-aligned etching operation. With this mask, the circuitry is protected by a double level of resist, so that the matrix etching can be completed to define the word lines. In other words, the intermediate dielectric 15, the POLY1 14, and the gate oxide are etched away. Before removing the resist, an implantation is performed to improve the isolation of the bit lines. As shown in FIG. 11, a $P^-$ implantation (e.g., of boron) is performed to improve the isolation of the bit lines 7. This boron implant affects the substrate regions adjacent to the bit lines 7 doped opposite from the bit lines. In essence, the isolation of the bit lines is insured by a diode junction that is reverse biased during the normal operation of the memory matrix. To avoid using the double level of resist, the POLY2 and self-aligned etching masks may be arranged to define the associated circuitry and matrix separately. This step is completed by a second cell sealing re-oxidation.

From this point on, the process is similar to a conventional CMOS process, and the steps for completing the memory device will now be briefly described without reference to any specific drawings. A mask N-LLD is used to implant the source and drain of the P-channel and N-channel transistors, as described in Applicant's U.S. Pat. No. 4,719,184, for example. The mask is arranged to screen the matrix so that the bit lines are not re-implanted and shorted. A mask P-LLD is used to re-implant the sources and drains of the P-channel transistors. Deposition and etching of a dielectric layer is performed to form the spacers. $N^+$ masking is done for the source and drain implants of the N-channel transistors, and $P^+$ masking is done for the source and drain implants of the P-channel transistors.

Further, an isolation dielectric layer is deposited, and a contact mask is used to define and etch the contacts. There is provided a contact and ion implantation mask. The removal of the resist is followed by an RTP thermal treatment to activate the implanted species. (This masking level and the thermal treatment are optional because they are only required for contacts self-aligned to the active area.) Next, there is deposition of the barrier, the tungsten, back-etching of the same, and metal deposition. A metal mask is used to define the metal stripes, and then there is deposition of the finishing dielectric. A pad exposing mask is used to define and etch pads.

In summary, the present invention provides a circuit architecture that is compact and simple in design. Because no high coupling is required between the floating gate and the control gate, the circuit space for this coupling can be eliminated. Further, the need for a dedicated isolation for the memory matrix is eliminated.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A method for manufacturing a virtual ground EPROM memory device having a matrix of virtual ground floating gate EPROM memory cells, the EPROM memory device including selection transistors and addressing circuitry having P-channel and N-channel MOS transistors, said method comprising the steps of:

forming a plurality of N-wells in at least a first portion of a substrate in order to accommodate the P-channel transistors;

defining active areas for transistors by using a screening mask and growing an isolation layer through apertures in the screening mask;

forming the virtual ground EPROM memory cell matrix in a second portion of the substrate; and forming a plurality of continuous bit lines that extend across the virtual ground EPROM memory cell matrix as discrete parallel continuous stripes, wherein the screening mask does not have apertures over the second portion of the substrate.

2. The method as defined in claim 1, further comprising the step of:

forming the selection transistors in a third portion of the substrate, wherein the screening mask is patterned so that apertures over the third portion of the substrate are narrower than apertures over a portion of the substrate in which the addressing circuitry is formed.

3. The method as defined in claim 1, further comprising the steps of:

implanting a first type of dopant for bit lines; and implanting a second type of dopant, which is opposite the first type, in the substrate in areas adjacent to the bit lines.

4. The method as defined in claim 1, further comprising the steps of:

growing a thin oxide layer in the second portion of the substrate;

depositing over the entire substrate a ply structure having a first conductive layer, an intermediate dielectric layer, and a second conductive layer;

etching the ply structure and the thin oxide layer to form a plurality of first parallel grooves that define the continuous bit lines; and implanting a first type of dopant through the first parallel grooves to give a predetermined conductivity to the bit lines.

5. The method as defined in claim 4, further comprising the steps of:

etching the ply structure to form a plurality of second parallel grooves that define word lines; and implanting a second type of dopant through the second parallel grooves to improve isolation of the bit lines.

6. The method as defined in claim 5, further comprising the steps of:

filling and planarizing the first parallel grooves using a dielectric; and depositing a third conductive layer and a fourth conductive layer over the remaining portion of the ply structure.

7. The method as defined in claim 5, wherein the second type of dopant is opposite the first type of dopant and is implanted in the substrate in areas adjacent to the bit lines.

8. A method for manufacturing a virtual ground EPROM memory device from a substrate, said method comprising the steps of:

forming a plurality of N-wells in a second portion of the substrate in order to accommodate P-channel transistors;

defining active areas for transistors by using a screening mask and growing an isolation layer through apertures in the screening mask;

forming a matrix of virtual ground EPROM memory cells in a first portion of the substrate;

forming a plurality of continuous bit lines that extend across the first portion of the substrate as discrete parallel continuous stripes; and forming transistors for control circuitry in the second portion of the substrate;

wherein the screening mask does not have apertures over the first portion of the substrate.

9. The method as defined in claim 8, wherein the step of forming transistors includes the sub-step of dividing the second portion of the substrate into a first sub-portion for selection transistors and a second sub-portion for addressing transistors, and the screening mask is patterned so that apertures over the first sub-portion are narrower than apertures over the second sub-portion.

10. The method as defined in claim 8, wherein the step of formning a plurality of continuous bit lines includes implanting a first type of dopant for bit lines, and the method further includes the step of implanting a second type of dopant, which is opposite the first type, in the substrate in areas adjacent to the bit lines.

* * * * *

UNITED STATES PATENT AND TRADEMARK OFFICE
CERTIFICATE OF CORRECTION

PATENT NO.   : 6,326,266 B1
DATED        : December 4, 2001
INVENTOR(S)  : Claudio Brambilla et al.

It is certified that error appears in the above-identified patent and that said Letters Patent is hereby corrected as shown below:

<u>Title page,</u>
Under the "Inventors" section change "Creda" to -- Cereda --
Under the "OTHER PUBLICATIONS" section change "olectron" to -- on electron --

Signed and Sealed this

Fourth Day of June, 2002

Attest:

Attesting Officer

JAMES E. ROGAN
Director of the United States Patent and Trademark Office